United States Patent
Wu

(10) Patent No.: US 10,468,416 B2
(45) Date of Patent: *Nov. 5, 2019

(54) SEMICONDUCTOR DEVICE COMPRISING GATE STRUCTURE SIDEWALLS HAVING DIFFERENT ANGLES

(71) Applicant: Micron Technology, Inc., Boise, ID (US)

(72) Inventor: Tieh-Chiang Wu, Taoyuan (TW)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/700,640

(22) Filed: Sep. 11, 2017

(65) Prior Publication Data

US 2017/0373069 A1    Dec. 28, 2017

Related U.S. Application Data

(63) Continuation of application No. 14/745,464, filed on Jun. 21, 2015, now Pat. No. 9,768,175.

(51) Int. Cl.
*H01L 29/66*    (2006.01)
*H01L 29/78*    (2006.01)
(Continued)

(52) U.S. Cl.
CPC .... *H01L 27/10823* (2013.01); *H01L 21/3085* (2013.01); *H01L 29/4236* (2013.01); *H01L 29/66621* (2013.01); *H01L 29/66659* (2013.01)

(58) Field of Classification Search
CPC ......... H01L 27/10823; H01L 27/10826; H01L 27/10808; H01L 27/1087; H01L 27/10879;
(Continued)

(56) References Cited

U.S. PATENT DOCUMENTS 6,605,845 B1    8/2003  Liang
7,045,846 B2 *  5/2006  Jang ................. H01L 27/10855
                                                      257/306
(Continued)

FOREIGN PATENT DOCUMENTS

CN       1956170 A    5/2007
CN     101553927 A   10/2009
(Continued)

OTHER PUBLICATIONS

Taiwanese Office Action and Search Report from Taiwanese Application No. 104124999, dated Apr. 12, 2017, 15 pages.
(Continued)

*Primary Examiner* — Natalia A Gondarenko
(74) *Attorney, Agent, or Firm* — TraskBritt

(57) ABSTRACT

The present disclosure provides a semiconductor device including a substrate, a first active region, a second active region, and a gate structure. The first active region and the second active region are disposed in the substrate. The gate structure includes a bottom, a first sidewall attached to the first active region, and a second sidewall attached to the second active region. The first sidewall and the bottom have a first point of intersection, and the first sidewall and a first horizontal line starting from the first point toward the substrate have a first included angle. The second sidewall and the bottom have a second point of intersection, and the second sidewall and a second horizontal line starting from the second point toward the substrate have a second included angle. The first included angle is different from the second included angle. A method for manufacturing a semiconductor device is provided herein.

16 Claims, 12 Drawing Sheets

(51) Int. Cl.
- *H01L 29/06* (2006.01)
- *H01L 29/417* (2006.01)
- *H01L 29/423* (2006.01)
- *H01L 27/108* (2006.01)
- *H01L 21/308* (2006.01)
- *H01L 21/336* (2006.01)

(58) Field of Classification Search
CPC .......... H01L 27/11507; H01L 27/0207; H01L 27/11521; H01L 27/10876; H01L 21/823418; H01L 21/823475; H01L 21/283; H01L 29/045; H01L 29/1037; H01L 29/41775; H01L 29/517; H01L 29/7834; H01L 29/151; H01L 29/41725; H01L 29/42316; H01L 29/51; H01L 29/41741; H01L 29/41766; H01L 29/4236; H01L 29/66621; H01L 29/66659; H01L 29/42328; H01L 29/42336; H01L 29/42352; H01L 29/66484; H01L 29/66825; H01L 29/78; H01L 29/7813; H01L 29/7825; H01L 29/7831; H01L 29/7835; H01L 29/7889; H01L 29/7827; H01L 29/0653; H01L 29/945; H01L 27/10891; H01L 29/66666; H01L 21/3085
USPC ... 257/288, 270, 27, 330, E21.549, E29.279, 257/E21.646; 438/253, 251, 254, 283, 438/40, 524
See application file for complete search history.

(56) References Cited

U.S. PATENT DOCUMENTS

| | | | |
|---|---|---|---|
| 7,244,650 B2* | 7/2007 | Suh | H01L 27/10873 257/E21.431 |
| 7,511,337 B2 | 3/2009 | Rauh et al. | |
| 8,178,440 B1 | 5/2012 | Wu et al. | |
| 8,884,340 B2* | 11/2014 | Kim | H01L 27/10873 257/270 |
| 9,768,175 B2* | 9/2017 | Wu | H01L 27/10823 |
| 2005/0173756 A1 | 8/2005 | Kim et al. | |
| 2005/0196947 A1 | 9/2005 | Seo et al. | |
| 2006/0049455 A1 | 3/2006 | Jang et al. | |
| 2007/0057313 A1 | 3/2007 | Kim | |
| 2008/0054386 A1 | 3/2008 | Akram | |
| 2008/0079071 A1 | 4/2008 | Kim | |
| 2009/0230464 A1 | 9/2009 | Taketani | |
| 2010/0117131 A1 | 5/2010 | Rouh et al. | |
| 2010/0302845 A1 | 12/2010 | Yang et al. | |
| 2015/0137221 A1 | 5/2015 | Kiyosawa et al. | |
| 2015/0357337 A1* | 12/2015 | Takaishi | H01L 27/0207 257/296 |

FOREIGN PATENT DOCUMENTS

| | | |
|---|---|---|
| CN | 102800582 B | 11/2012 |
| TW | 200952126 A | 12/2009 |
| TW | 201123266 A1 | 7/2011 |
| TW | I358826 B | 2/2012 |
| TW | 201241931 A1 | 10/2012 |
| TW | 201310581 A1 | 3/2013 |
| TW | 201320307 A1 | 5/2013 |
| TW | I434399 B | 4/2014 |
| WO | 2014178094 A1 | 11/2014 |

OTHER PUBLICATIONS

Chinese Office Action and Search Report from Chinese Application No. 201510474232.5, dated Aug. 24, 2018, 18 pages.
Chinese Office Action from Chinese Application No. 201510474232.5, dated Apr. 18, 2019, 7 pages.

* cited by examiner

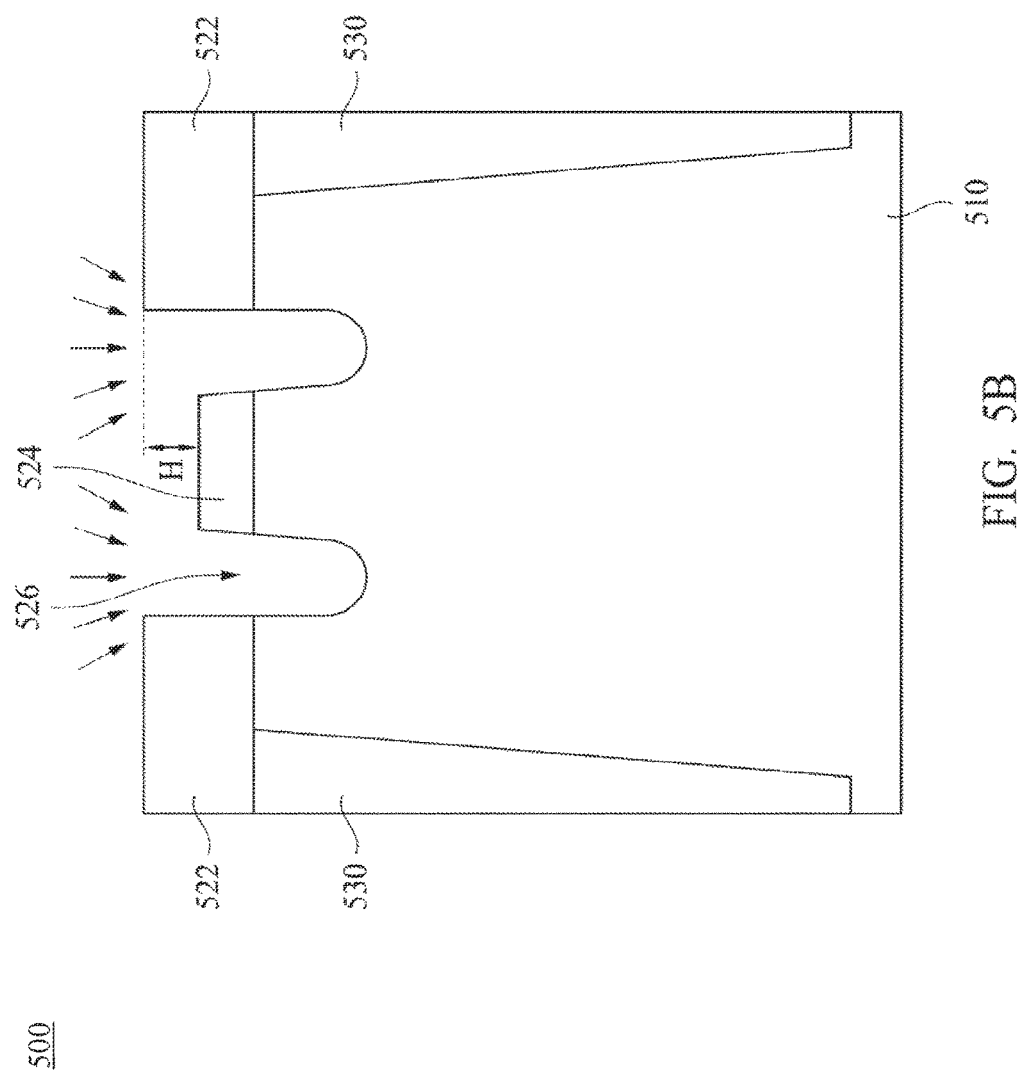

SEMICONDUCTOR DEVICE COMPRISING GATE STRUCTURE SIDEWALLS HAVING DIFFERENT ANGLES

CROSS-REFERENCE TO RELATED APPLICATION

This application is a continuation of U.S. patent application Ser. No. 14/745,464, filed Jun. 21, 2015, now, U.S. Pat. No. 9,768,175 issued Sep. 19, 2017, the disclosure of which is hereby incorporated herein in its entirety by this reference.

TECHNICAL FIELD

The present invention relates to a semiconductor device, more particularly to a memory device.

BACKGROUND

A Dynamic Random Access Memory (DRAM) is an essential element in many electronic products. To increase component density and improve overall performance of DRAM, industrial manufacturers make constant efforts to reduce the sizes of transistors for the DRAM. However, as the transistor size is reduced, the word line to word line (WL to WL) disturbance in the memory device is increasingly generated. The operation failure of the memory cell may therefore occur due to the WL to WL disturbance.

In this regard, an improved semiconductor structure and manufacturing method for the memory device are still necessary to solve the problems met in the art.

BRIEF SUMMARY

An aspect of the present invention is to provide a semiconductor device including a substrate, a first active region, a second active region, and a gate structure. The first active region and the second active region are disposed in the substrate. The gate structure is disposed in the substrate and between the first active region and the second active region.

The gate structure includes a bottom, a first sidewall and a second sidewall. The first sidewall is attached to the first active region, and the first sidewall and the bottom have a first point of intersection. The first sidewall and a first horizontal line starting from the first point toward the substrate have a first included angle. The second sidewall is attached to the second active region, and the second sidewall and the bottom have a second point of intersection. The second sidewall and a second horizontal line starting from the second point toward the substrate have a second included angle. The first included angle is different from the second included angle.

In various embodiments of the present disclosure, the first included angle is less than the second included angle.

In various embodiments of the present disclosure, the semiconductor device further includes a gate dielectric layer disposed between the gate structure and the first active region and between the gate structure and the second active region.

In various embodiments of the present disclosure, the gate structure includes a first portion and a second portion disposed between the first portion and the first active region and between the first portion and the second active region.

In various embodiments of the present disclosure, the first active region is a source electrode, and the second active region is a drain electrode.

In various embodiments of the present disclosure, a memory cell includes the first active region, the gate structures, and the second active region.

In various embodiments of the present disclosure, the semiconductor device further includes a plurality of isolation structures, and the memory cell disposed between adjacent two of the isolation structures.

Another aspect of the present invention is to provide a semiconductor device including a substrate and a dual gate structure. The dual gate structure is disposed in the substrate, and has two gate stacks.

Each of the gate stacks includes a bottom, a first sidewall and a second sidewall. The first sidewall and the bottom have a first point of intersection. The first sidewall and a first horizontal line starting from the first point toward the substrate have a first included angle. The first sidewalls of the gate stacks face to each other. The second sidewall and the bottom have a second point of intersection. The second sidewall and a second horizontal line starting from the second point toward the substrate have a second included angle. The first included angle is less than the second included angle.

In various embodiments of the present disclosure, the first included angle is 0.5 to 10 degrees less than the second included angle.

In various embodiments of the present disclosure, the semiconductor device further includes a first active region and a second active region. The first active region is disposed in the substrate and between the gate stacks of the dual gate structure. The second active region is disposed in the substrate and each of the gate stacks is disposed between the first active region and the second active region.

In various embodiments of the present disclosure, the semiconductor device further includes a gate dielectric layer disposed between one of the gate stacks and the first active region and between one of the gate stacks and the second active region.

In various embodiments of the present disclosure, each of the gate stacks of the dual gate structure includes a first portion and a second portion disposed between the first portion and the first active region and between the first portion and the second active region.

In various embodiments of the present disclosure, the first active region is a source electrode, and the second active region is a drain electrode.

In various embodiments of the present disclosure, a memory cell is composed of the first active region, the dual gate structure, and the second active regions.

In various embodiments of the present disclosure, the semiconductor device further includes a plurality of isolation structures, and the memory cell is disposed between adjacent two of the isolation structures.

Further, another aspect of the present invention is to provide a method for manufacturing a semiconductor device. The method includes the following steps. A mask is formed on a substrate, which includes the following steps. A first etching layer is formed on the substrate. A part of the first etching layer is removed to form an opening exposing a part of the substrate. A spacer material is formed on a sidewall of the first etching layer in the opening. A second etching layer is formed in the opening. The spacer material is removed to form a plurality of trenches between the first etching layer and the second etching layer.

The first etching layer and the second etching layer are etched to form a height difference between a top surface of the first etching layer and a top surface of the second etching layer. The trenches are etched to form a recessed gate trench in the substrate, which includes the following steps. A first sidewall of the recessed gate trench is formed to be attached to the first etching layer, and the first sidewall and a bottom of the gate trench form a first point of intersection. The first sidewall and a first horizontal line starting from the first point toward the substrate have a first included angle. A second sidewall of the recessed gate trench is formed to be attached to the second etching layer, and the second sidewall and the bottom form a second point of intersection. The second sidewall and a second horizontal line starting from the second point toward the substrate have a second included angle. The first included angle is formed less than the second included angle.

In various embodiments of the present disclosure, forming the spacer material on the sidewall of the first etching layer includes forming a spacer material layer covering the first etching layer and the substrate; and etching the spacer material layer to leave a part of the spacer material on the sidewall of the second etching layer.

In various embodiments of the present disclosure, the method further includes the following steps. A gate structure is formed in the recessed gate trench. A first active region is formed in the substrate and attached to the first sidewall of the recessed gate trench. A second active region is formed in the substrate and attached to the second sidewall of the recessed gate trench.

In various embodiments of the present disclosure, forming the gate structure in the recessed gate trench further includes forming a first portion; and forming a second portion between the first portion and the first active region and between the first portion and the second active region.

In various embodiments of the present disclosure, forming the first active region is forming a source electrode; and forming the second active region is forming a drain electrode.

These and other features, aspects, and advantages of the present disclosure will become better understood with reference to the following description and appended claims.

It is to be understood that both the foregoing general description and the following detailed description are by example, and are intended to provide further explanation of the invention as claimed.

BRIEF DESCRIPTION OF THE DRAWINGS

The disclosure could be more fully understood by reading the following detailed description of the embodiment, with reference made to the accompanying drawings as follows:

FIGS. 5A-5C are schematic cross-sectional views of a semiconductor device at various stages of fabrication according to various embodiments of the present disclosure;

DETAILED DESCRIPTION

Figure 1:
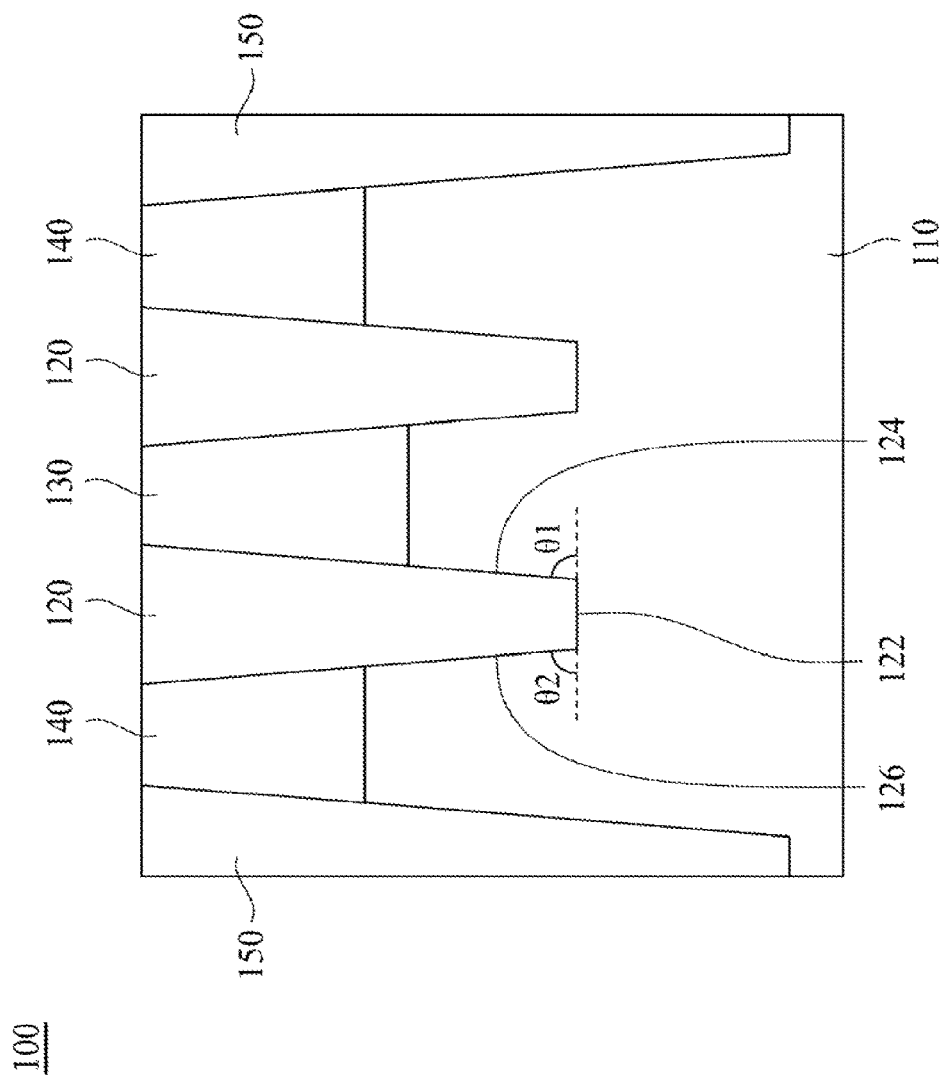
FIG. 1 is a schematic cross-sectional view of a conventional semiconductor device.

Reference will now be made in detail to the present embodiments of the invention, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

FIG. 1 is a schematic cross-sectional view of a conventional semiconductor device 100. In FIG. 1, the conventional semiconductor device 100 has a substrate 110, two gate structures 120, a source region 130, two drain regions 140 and two shallow trench isolations (STIs) 150. The gate structures 120, the source region 130, the drain regions 140 and the STIs 150 are disposed in the substrate 110, and the gate structures 120, the source region 130, the drain regions 140 are disposed between two of the STIs 150. The source region 130 is disposed between two of the gate structures 120, and each of the gate structures 120 is disposed between the source region 130 and one of the drain regions 140.

The gate structure 120 has a bottom 122, a first sidewall 124 and a second sidewall 126. The bottom 122 and the first sidewall 124 have a first point of intersection. The first sidewall and a first horizontal line starting from the first point toward the substrate 110 have a first angle ($\theta 1$). The bottom 122 and the second sidewall 126 have a second point of intersection. The second sidewall 126 and a second horizontal line starting from the second point toward the substrate 110 have a second angle ($\theta 2$). It is worthy to note that, the first angle ($\theta 1$) is equal to the second angle ($\theta 2$). However, as the size of the semiconductor device is reduced, the word line (WL) to word line disturbance in the semiconductor device is generated. An operation fail of the semiconductor device is therefore induced due to the WL to WL disturbance. Therefore, improved semiconductor structure and manufacturing method thereof are necessary to solve the problems met in the art.

Figure 2:
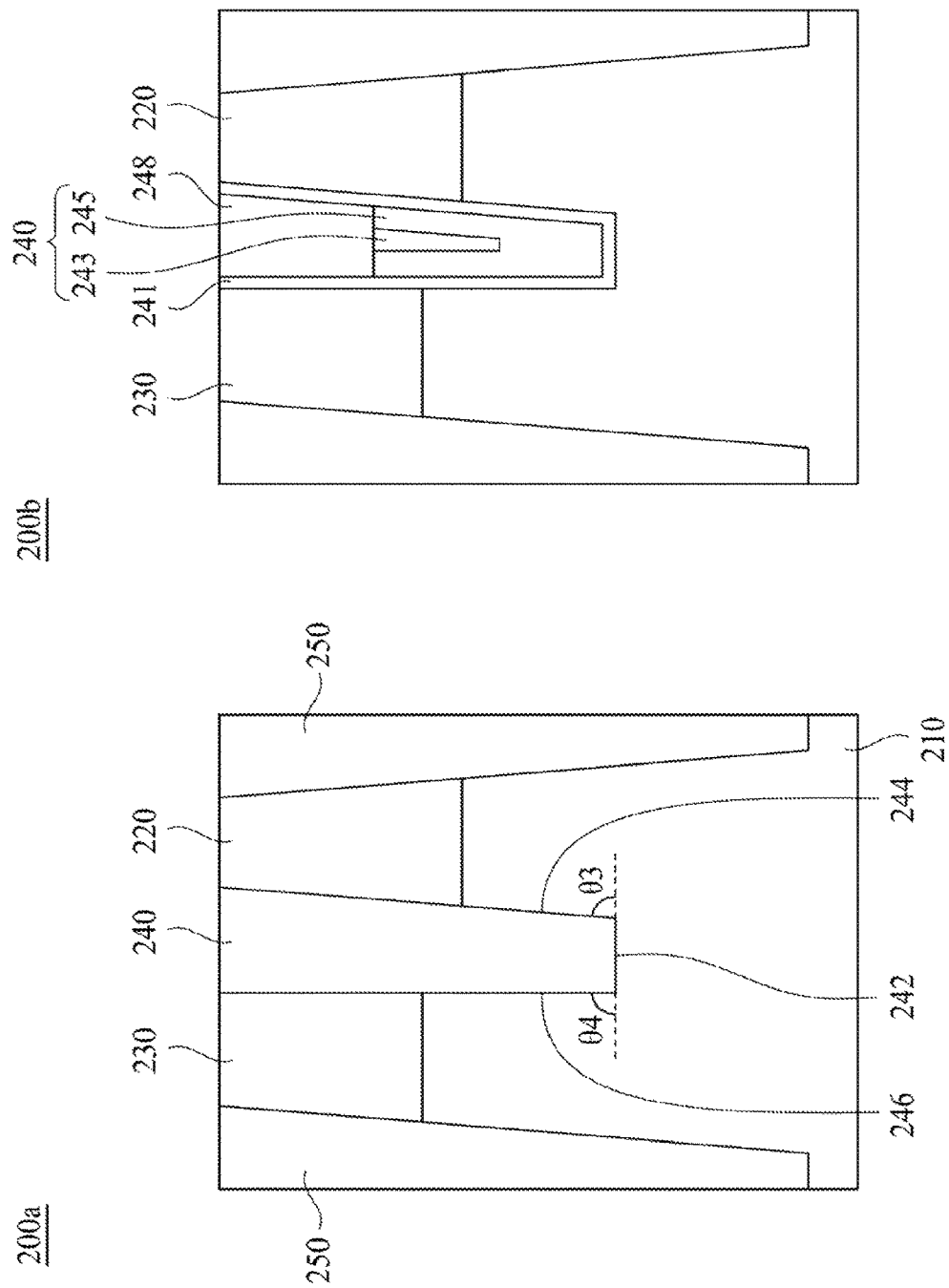
FIGS. 2A and 2B are schematic cross-sectional views of a semiconductor device according to various embodiments of the present disclosure.

Referring to FIG. 2A, a semiconductor device 200a according to various embodiments of the present disclosure is provided. In FIG. 2A, the semiconductor device 200a includes a substrate 210, a first active region 220, a second active region 230, and a gate structure 240. The first active region 220 and the second active region 230 are disposed in the substrate 210. The gate structure 240 is disposed in the substrate 210 and between the first active region 220 and the second active region 230. In various embodiments of the present disclosure, the first active region 220 is a source electrode, and the second active region 230 is a drain electrode.

In various embodiments of the present disclosure, a memory cell includes the first active region 220, the gate structures 240, and the second active region 230. In various embodiments of the present disclosure, the semiconductor device 200a further includes a plurality of isolation structures 250, and the memory cell disposed between adjacent two of the isolation structures 250.

The gate structure 240 includes a bottom 242, a first sidewall 244 and a second sidewall 246. The first sidewall 244 is attached to the first active region 220, and the first sidewall 244 and the bottom 242 have a first point of intersection. The first sidewall 244 and a first horizontal line starting from the first point toward the substrate 210 have a first included angle (θ3). The second sidewall 246 is attached to the second active region 230, and the second sidewall 246 and the bottom 242 have a second point of intersection. The second sidewall 246 and a second horizontal line starting from the second point toward the substrate 210 have a second included angle (θ4). The first included angle (θ3) is different from the second included angle (θ4). The first sidewall 244, the second sidewall 246, and the bottom 242 are linear.

In various embodiments of the present disclosure, a depth of the first active region 220 is greater than a depth of the second active region 230, so that an electric field of the gate structure 240 between the first active region 220 and the second active region 230 is asymmetric. In this case, the gate structure 240 in accordance with the present disclosure is designed to be asymmetric. In other words, the first included angle (θ3) is different from the second included angle (θ4). In various embodiments of the present disclosure, the first included angle (θ3) is less than the second included angle (θ4).

Referring to FIG. 2B, a semiconductor device 200b is provided. In FIG. 2B, a gate dielectric layer 241 is further disposed between the gate structure 240 and the first active region 220 and between the gate structure 240 and the second active region 230. In one embodiment of the present disclosure, the gate structure 240 includes a first portion 243 and a second portion 245 disposed between the first portion 243 and the first active region 220 and between the first portion 243 and the second active region 230. In another embodiment of the present disclosure, a dielectric layer 248 is disposed on the gate structure 240.

Figure 3:
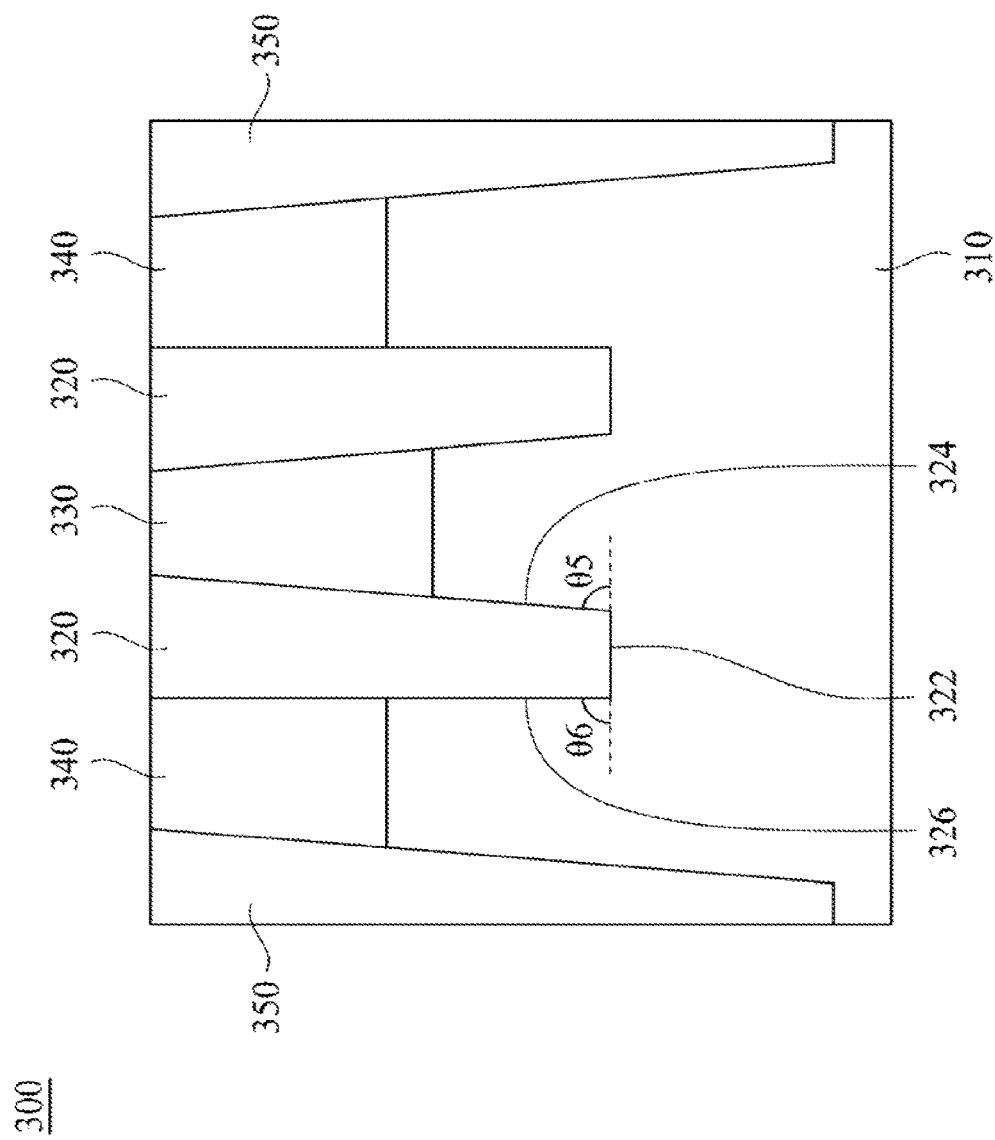
FIG. 3 is a schematic cross-sectional view of a semiconductor device according to various embodiments of the present disclosure.

FIG. 3 is a schematic cross-sectional view of a semiconductor device 300 according to various embodiment of the present disclosure. In FIG. 3, the semiconductor device 300 includes a substrate 310 and a dual gate structure 320. The dual gate structure 320 is disposed in the substrate 310, and has two gate stacks.

Each of the gate stacks includes a bottom 322, a first sidewall 324 and a second sidewall 326. The first sidewalls 324 of the gate stacks face to each other. The first sidewall 324 and the bottom 322 have a first point of intersection. The first sidewall 324 and a first horizontal line starting from the first point toward the substrate 310 have a first included angle (θ5). The second sidewall 326 and the bottom 322 have a second point of intersection. The second sidewall 326 and a second horizontal line starting from the second point toward the substrate 310 have a second included angle (θ6). The first sidewall 324 the second sidewall 326, and the bottom 322 are linear. The first sidewall 324 and the second sidewall 326 extend linearly from the bottom 322 of the gate stacks to a top surface of the source electrode or to a top surface of the drain electrode. The first included angle (θ5) is less than the second included angle (θ6). In various embodiments of the present disclosure, the first included angle (θ5) is 0.5 to 10 degrees less than the second included angle (θ6).

Different from the conventional semiconductor device 100, the distance between the bottoms of two adjacent gate stacks is constant while the size of the semiconductor device 300 is reduced, such that the word line (WL) to word line disturbance in the semiconductor device 300 may be not induced. Therefore, the performance of the semiconductor device 300 in a smaller size may be significantly increased.

In FIG. 3, the semiconductor device 300 further includes a first active region 330 and two second active regions 340. The first active region 330 is disposed in the substrate 310 and between the gate stacks of the dual gate structure 320. The second active regions 340 are disposed in the substrate 310 and each of the gate stacks is disposed between the first active region 330 and one of the second active regions 340. In various embodiments of the present disclosure, the first active region 330 is a source electrode, and the second active region 340 is a drain electrode.

In FIG. 3, a memory cell is composed of the first active region 330. The dual gate structure 320, and the second active regions 340. In various embodiments of the present disclosure, the semiconductor device 300 further includes a plurality of isolation structures 350, and the memory cell is disposed between adjacent two of the isolation structures 350.

Figure 4:
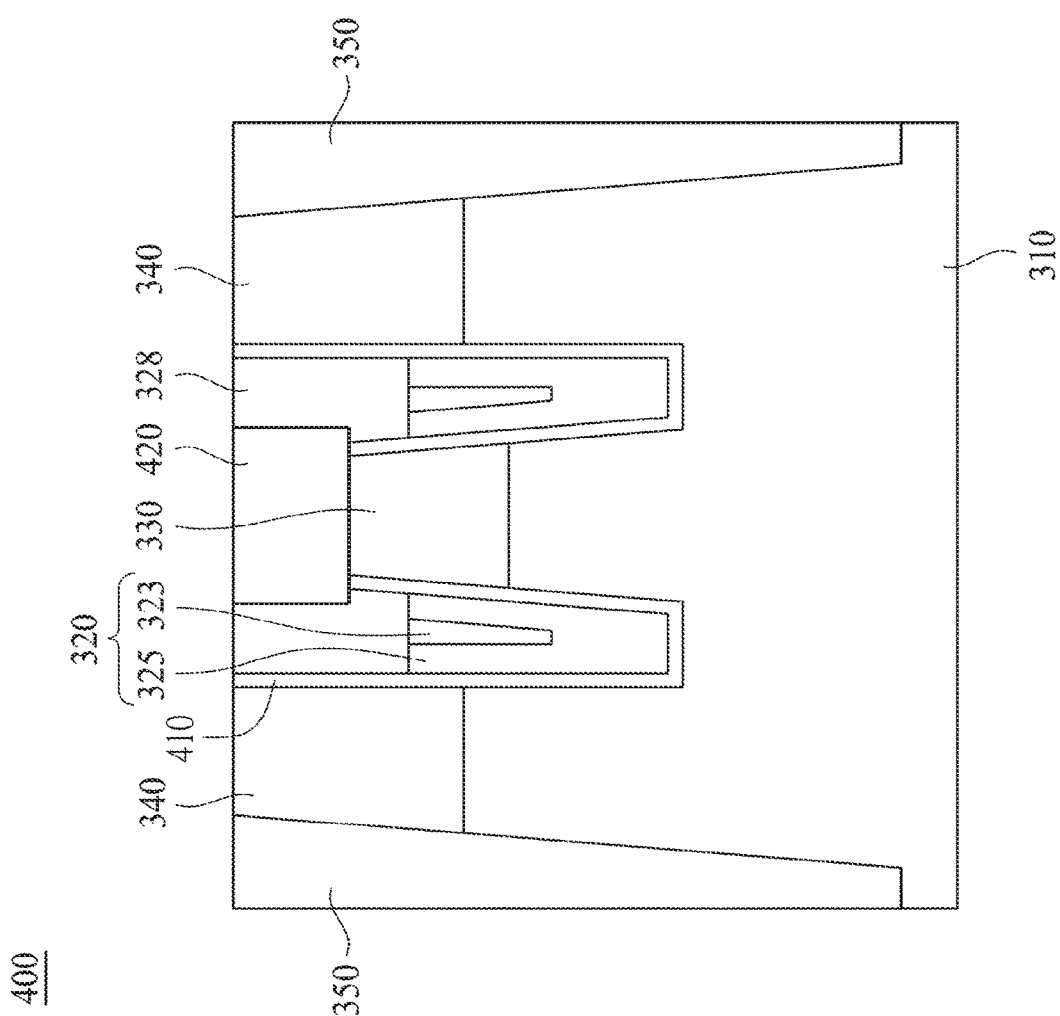
FIG. 4 is a schematic cross-sectional view of a semiconductor device according to various embodiments of the present disclosure.

FIG. 4 is a schematic cross-sectional view of a semiconductor device 400 according to various embodiment of the present disclosure. In FIG. 4, the semiconductor device 400 is similar to the semiconductor device 300. Different from the semiconductor device 300 in FIG. 3, the semiconductor device 400 further includes a gate dielectric layer 410 disposed between one of the gate stacks and the first active region 330 and between one of the gate stacks and one of the adjacent second active regions 340. Furthermore, In FIG. 4, each of the gate stack of the dual gate structure 320 includes a first portion 323 and a second portion 325 disposed between the first portion 323 and the first active region 330 and between the first portion 323 and one of the second active regions 340. In one embodiment of the present disclosure, a dielectric layer 328 is disposed on each of the gate stacks of the dual gate structure 320. In another embodiment of the present disclosure, a contact 420 is disposed on and attached to the first active region 330.

Figure 5A:
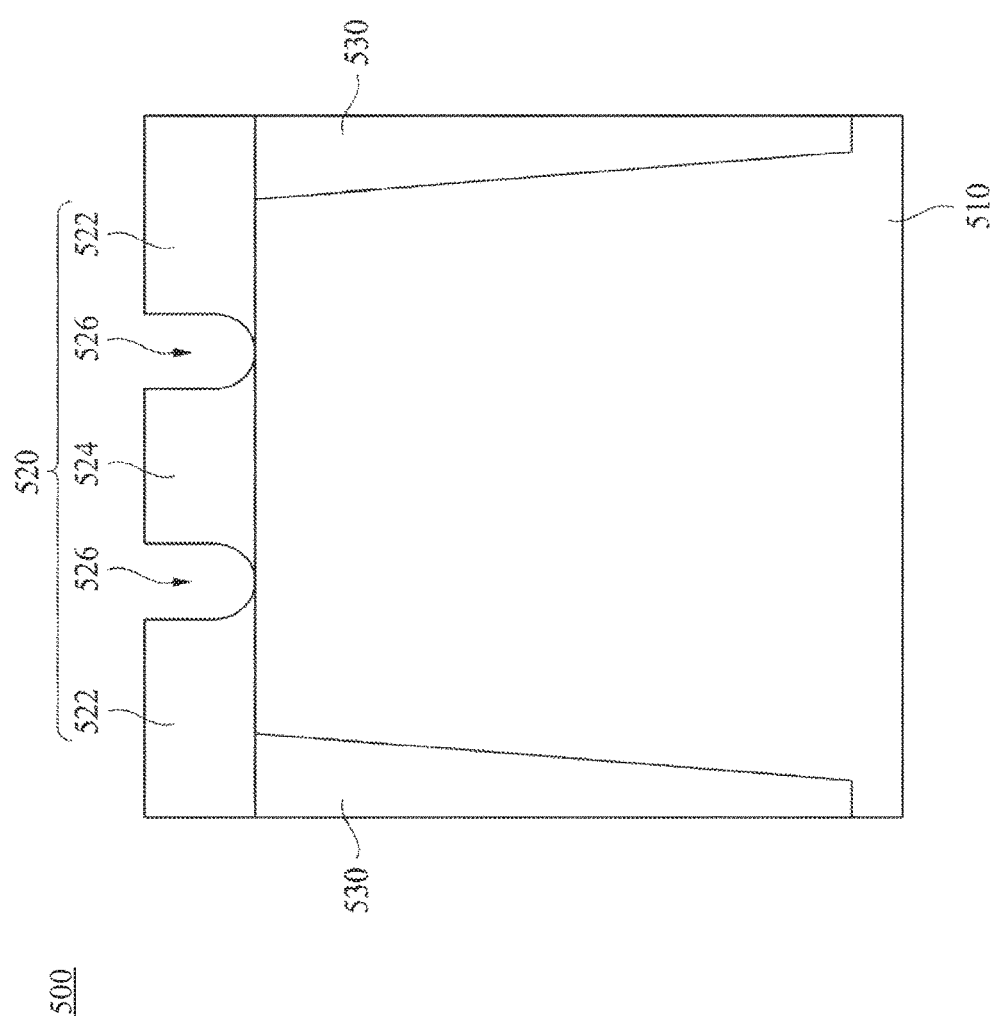
Figure 5C:
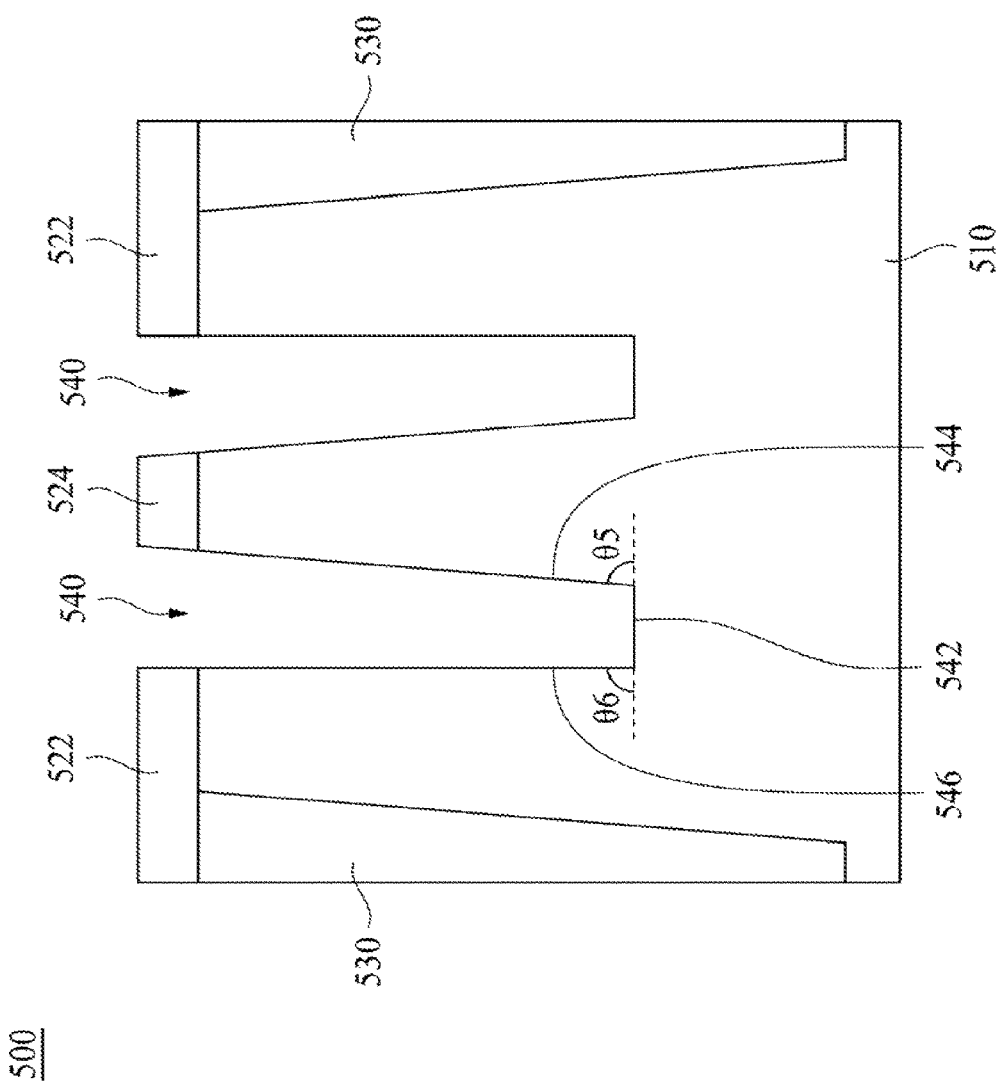

FIGS. 5A-5C are schematic cross-sectional views of a semiconductor device 500 at various stages of fabrication according to various embodiment of the present disclosure.

Figure 6:
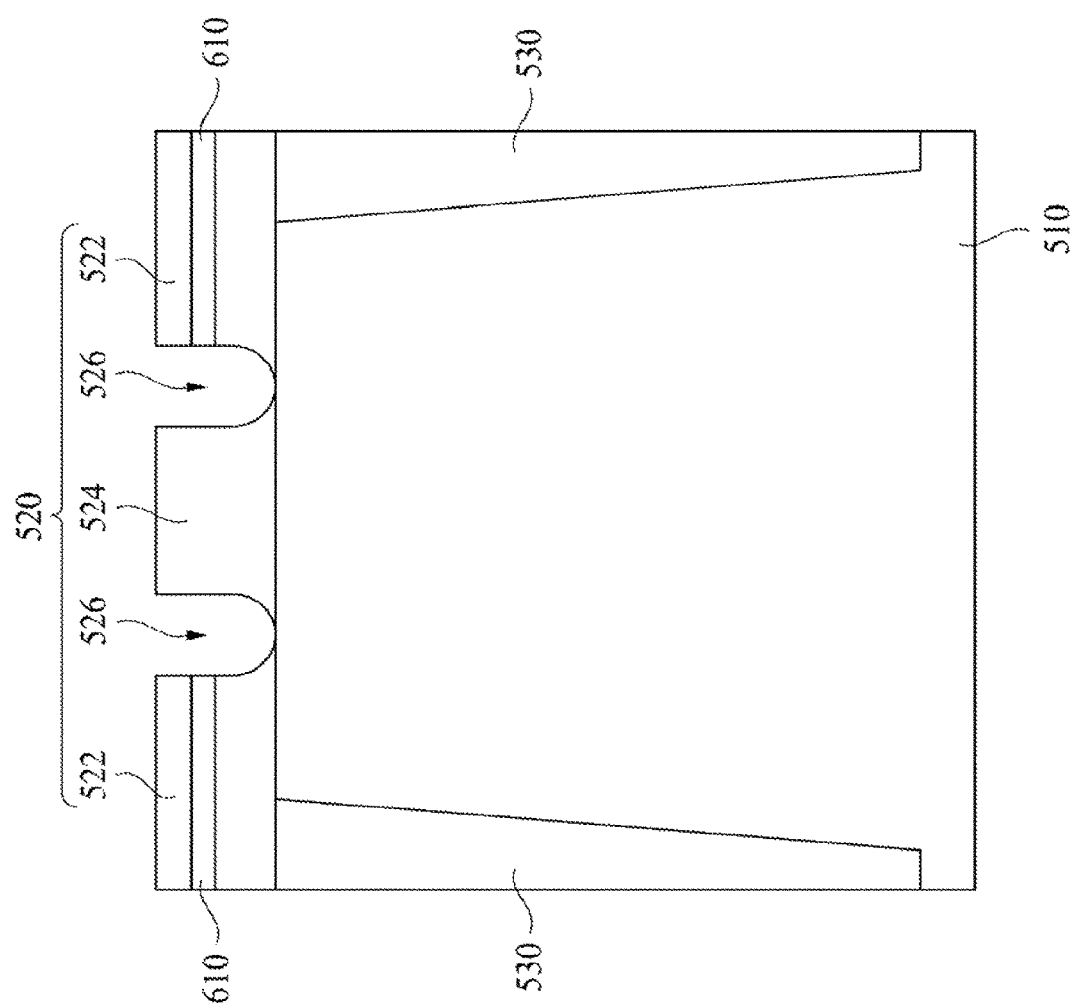
FIG. 6 is a schematic cross-sectional view of a semiconductor device at various stages of fabrication according to various embodiments of the present disclosure.

In FIG. 5A, a mask 520 is formed on a substrate 510 including a plurality of isolation structures 530. The mask 520 includes a first etching layer 522, a second etching layer 524 and a plurality of trenches 526. The first etching layer 522 and the second etching layer 524 are formed to be coplanar. The trenches 526 are formed between the first etching layer 522 and the second etching layer 524. In one embodiment of the present disclosure, the first etching layer 522 further includes a hard mask 610, as shown in FIG. 6. The step of forming the mask 520 on the substrate 510 includes the following steps as shown in FIGS. 7A-7D.

Figure 7A:
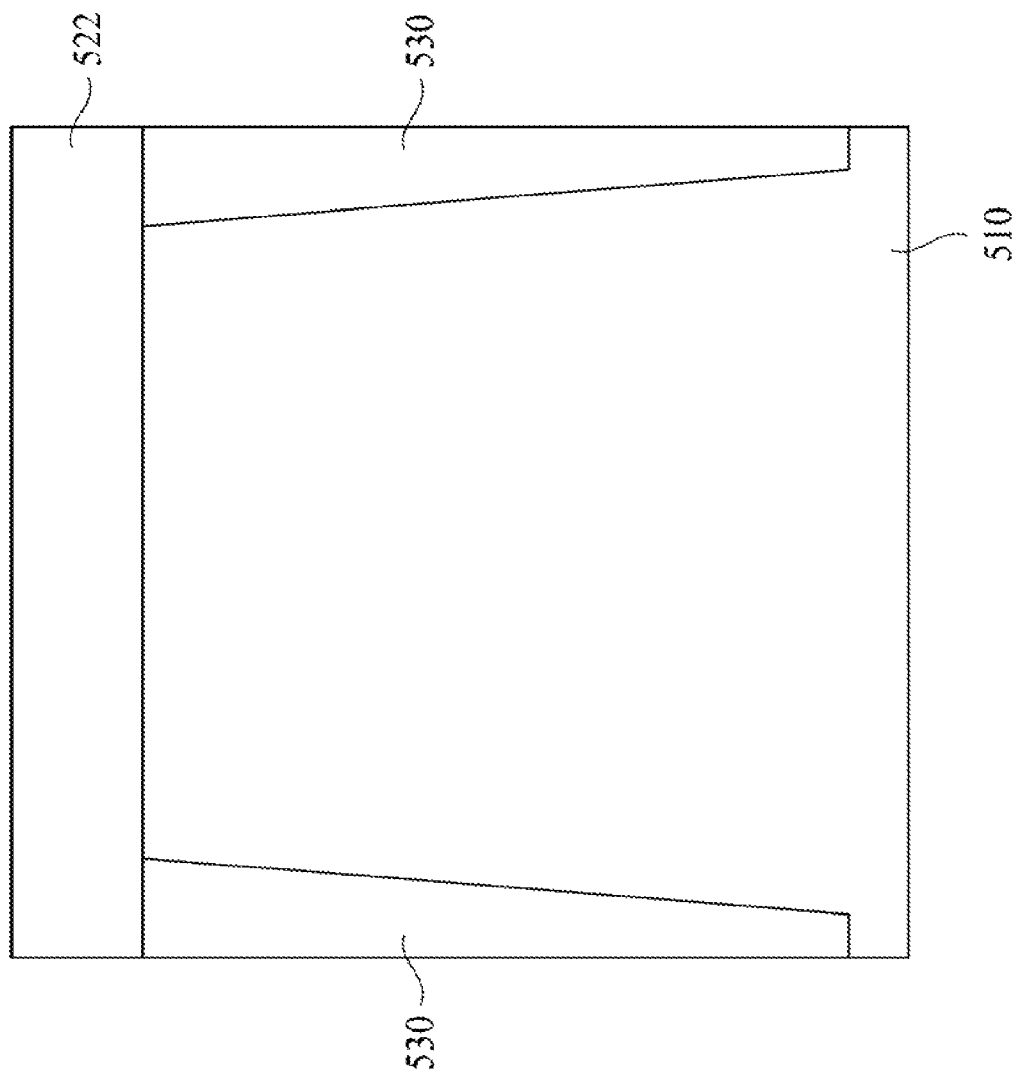
FIGS. 7A-7D are schematic cross-sectional views of a semiconductor device at various stages of fabrication according to various embodiments of the present disclosure.
Figure 7B:
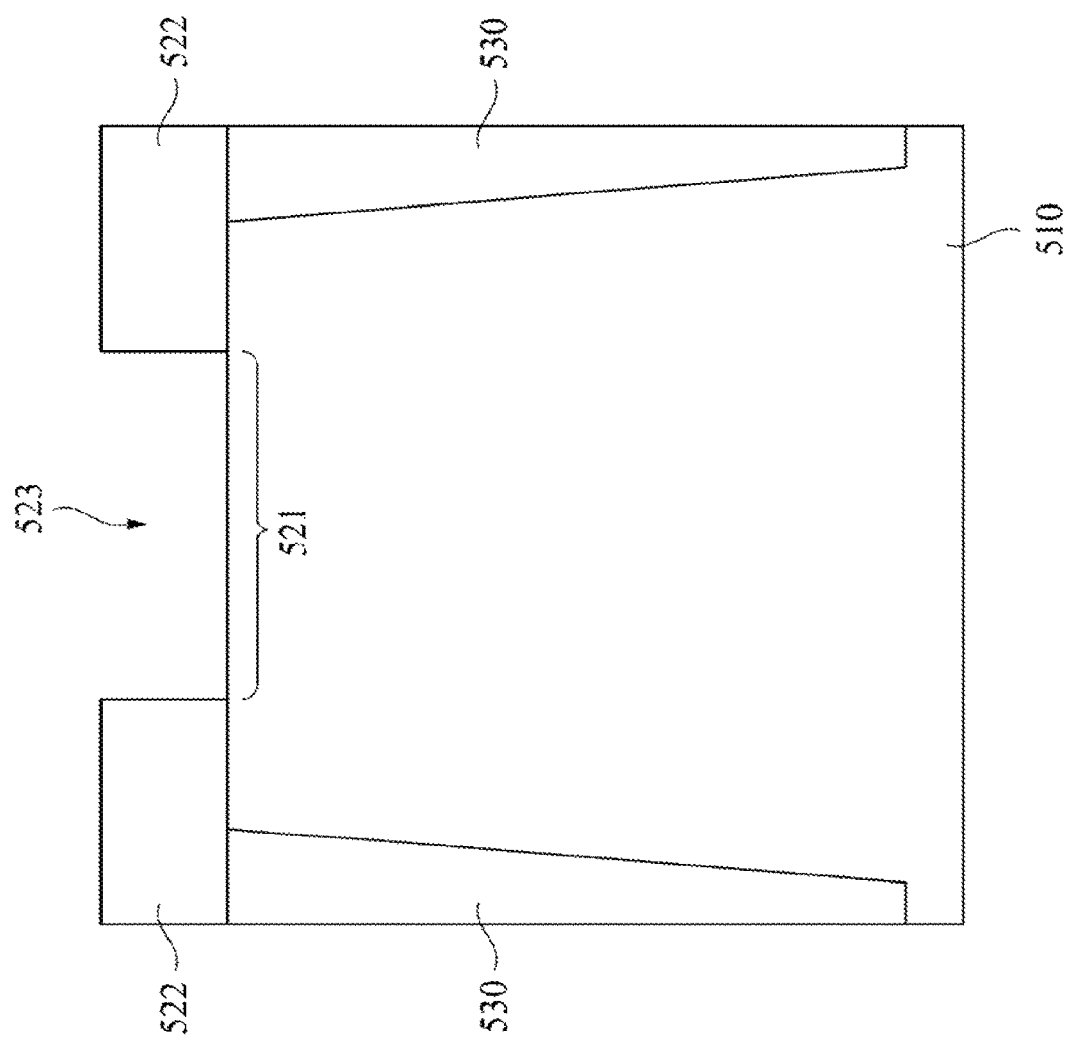

Referring to FIG. 7A, the first etching layer 522 is formed on the substrate 510. In embodiments of the present disclosure, the first etching layer 522 is formed on the substrate 510 by a spin-coating process, a CVD process or a PVD process, and the claimed scope of the present invention is not limited in this respect. An opening 523 is formed at a first etching region 521 of the mask 520, as shown in FIG. 7B. In embodiments of the present disclosure, the opening 523 is formed at the first etching region 521 of the mask 520 by a lithographic process, and the claimed scope of the present invention is not limited in this respect.

Figure 7C:
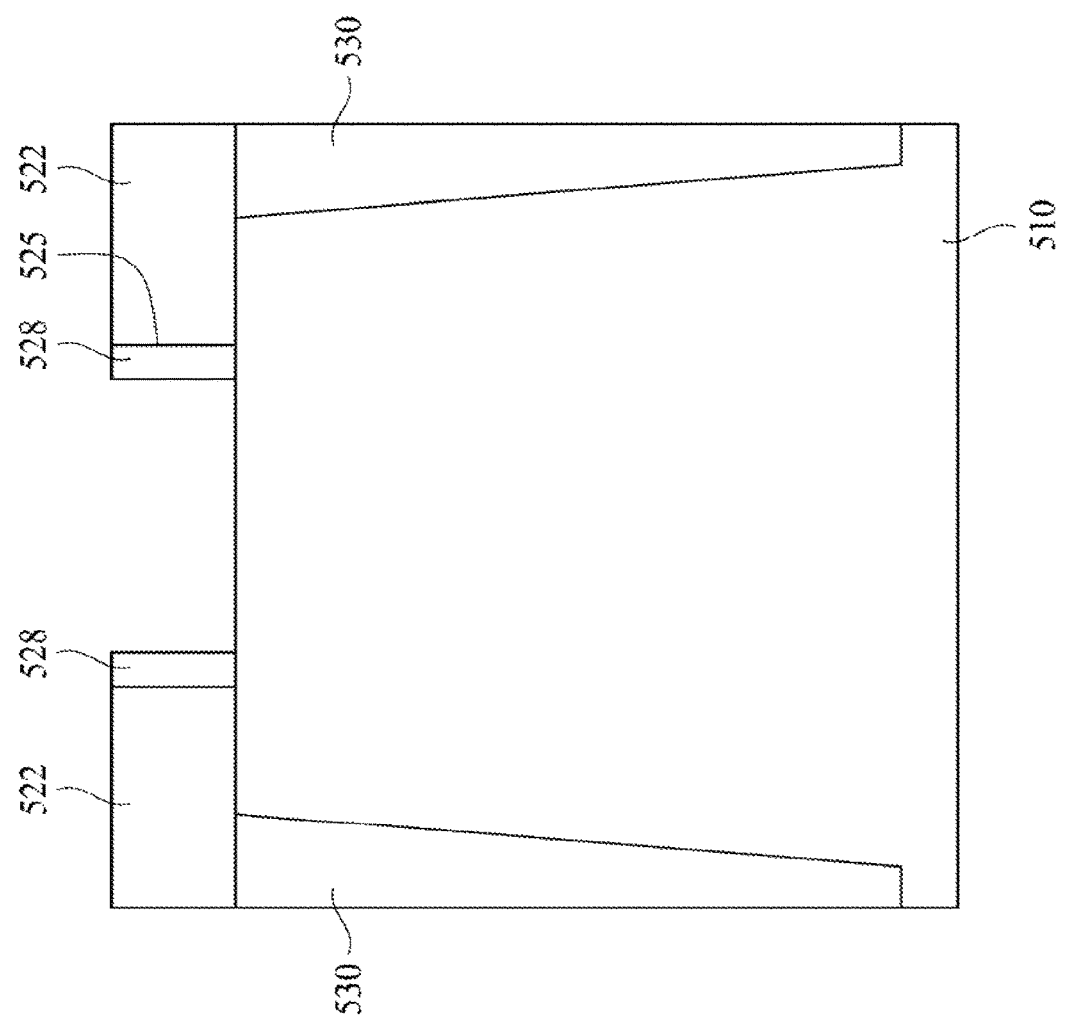

In FIG. 7C, a spacer material 528 is formed on a sidewall 525 of the first etching layer 522. In embodiments of the present disclosure, a spacer material layer (not shown)

formed of the spacer material is formed to cover the first etching layer 522 and the substrate 510. In embodiments of the present disclosure, a part of the spacer material layer is removed by a dry etching process to leave the spacer material 528 on the sidewall 525 of the first etching layer 522.

Figure 7D:
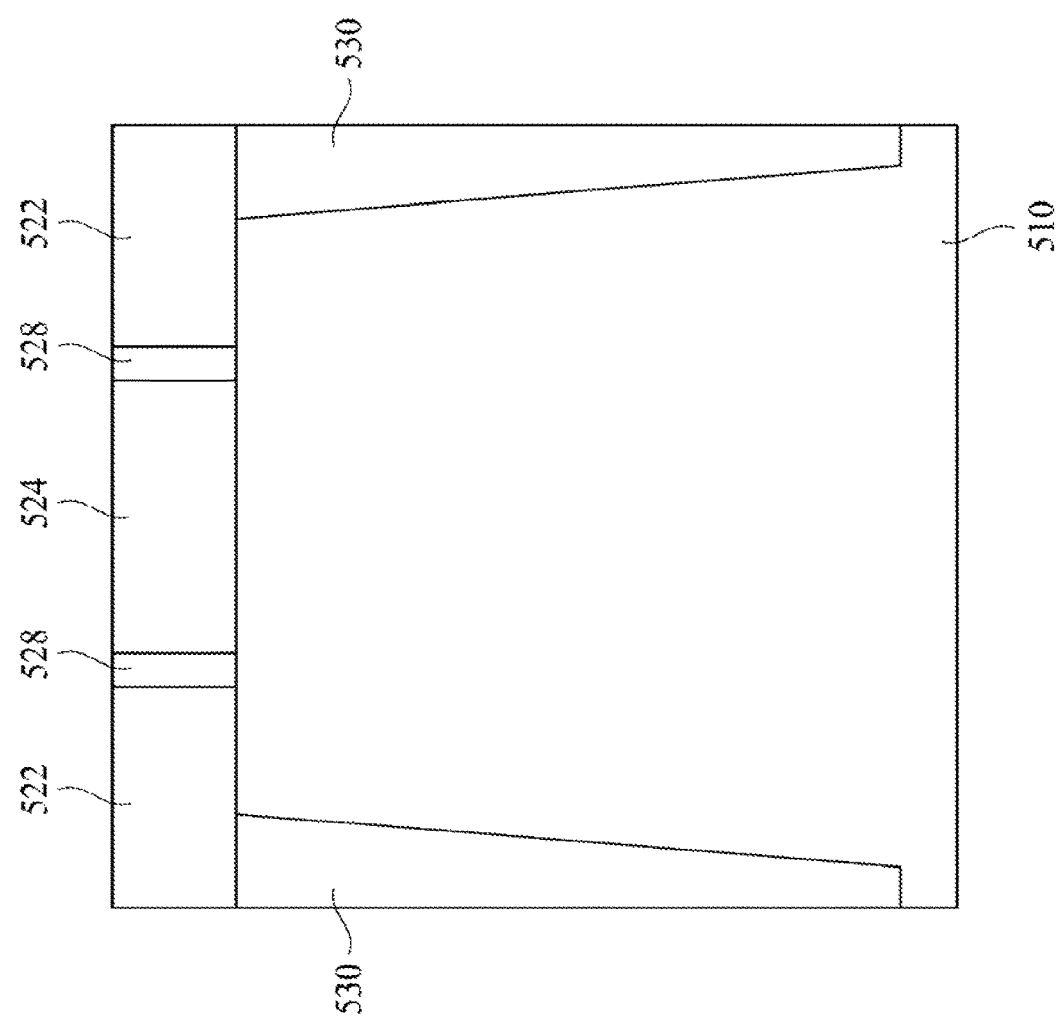

Referring to FIG. 7D, the second etching layer 524 is formed in the opening 523 at the first etching region 521 of the mask 520. In embodiments of the present disclosure, the second etching layer 524 is formed in the opening 523 by a spin-coating process, a CVD process or a PVD process, and the claimed scope of the present invention is not limited in this respect. The spacer material 528 is removed to form a plurality of trenches 526 between the first etching layer 522 and the second etching layer 524, as shown in FIG. 5A.

Referring to FIG. 5B, the first etching layer 522 and the second etching layer 524 are etched to form a height difference (H) between a top surface of the first etching layer 522 and a top surface of the second etching layer 524. In embodiments of the present disclosure, the etching rate of the second etching layer 524 is greater than that of the first etching layer 522, so that the removal amount of the second etching layer 524 is greater than the removal amount of the first etching layer 522 in a dry etching process. Therefore, a thickness of the first etching layer 522 is greater than a thickness of the second etching layer 524 in the beginning of the dry etching process.

As the thickness of the first etching layer 522 is greater than the thickness of the second etching layer 524, the plasma in the dry etching process may be blocked by the first etching layer 522, but not blocked by the second etching layer 524. Therefore, after the dry etching process, the trenches 526 are formed to be a plurality of tilt recessed gate trenches 540 in the substrate 510.

In detail, a first sidewall 544 of the recessed gate trench 540 is formed to be attached to the second etching layer 524, and the first sidewall 544 and a bottom 542 of the recessed gate trench 540 form a first point of intersection. The first sidewall 544 and a first horizontal line starting from the first point toward the substrate 510 have a first included angle (θ5). Similarly, a second sidewall 546 of the recessed gate trench 540 is formed to be attached to the first etching layer 522, and the second sidewall 546 and the bottom 542 form a second point of intersection. The second sidewall 546 and a second horizontal line starting from the second point toward the substrate 510 have a second included angle (θ6). The first included angle (θ5) is formed less than the second included angle (θ6).

In various embodiments of the present disclosure, a gate structure 320 as shown in FIG. 3 is formed in the recessed gate trench 540. In various embodiments of the present disclosure, a first active region 330 as shown in FIG. 3 is formed in the substrate 510 and attached to the first sidewall 544 of the recessed gate trench 540. In various embodiments of the present disclosure, forming the first active region 330 is forming a source electrode. In various embodiments of the present disclosure, a second active region 340 as shown in FIG. 3 is formed in the substrate 510 and attached to the second sidewall 546 of the recessed gate trench 540. In various embodiments of the present disclosure, forming the second active region 340 is forming a drain electrode.

In various embodiments of the present disclosure, forming the gate structure 320 as shown in FIG. 4 in the recessed gate trench 540 further includes forming a first portion 323 as shown in FIG. 4; and forming a second portion 325 as shown in FIG. 4 between the first portion 323 and the first active region 330 and between the first portion 323 and the second active region 340.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the appended claims.

What is claimed is:

1. A semiconductor device, comprising:
 a source electrode and two drain electrodes, a depth of the source electrode greater than a depth of the two drain electrodes;
 two gate stacks, each of the gate stacks between the source electrode and one of the drain electrodes, each of the two gate stacks comprising:
  a first sidewall of each of the gate stacks adjacent to the source electrode and a second sidewall of each of the gate stacks adjacent to one of the drain electrodes, the first sidewall, the second sidewall, and a bottom of each of the gate stacks being linear, the first sidewall extending from the bottom of each of the gate stacks to a top surface of the source electrode, the second sidewall extending from the bottom of each of the gate stacks to a top surface of one of the drain electrodes, and an angle formed by an intersection between the first sidewall and the bottom of each of the gate stacks differs from another angle formed by an intersection between the second sidewall and the bottom of each of the gate stacks; and
 an isolation structure in direct contact with each of the two drain electrodes.

2. The semiconductor device of claim 1, wherein the isolation structure is laterally adjacent to each of the two drain electrodes.

3. The semiconductor device of claim 1, further comprising a contact over the source electrode.

4. The semiconductor device of claim 1, further comprising a gate dielectric material on the first sidewall and the second sidewall of the two gate stacks.

5. The semiconductor device of claim 1, further comprising a dielectric material over each of the two gate stacks.

6. A semiconductor device, comprising:
 a source electrode and a drain electrode, a depth of the source electrode greater than a depth of the drain electrode;
 a dielectric material between the source electrode and the drain electrode;
 an isolation structure in direct contact with each of the source electrode and the drain electrode; and
 a gate structure below the dielectric material and between the source electrode and the drain electrode, the gate structure comprising:
  sidewalls of the gate structure adjacent to the source electrode and to the drain electrode, a first sidewall of the sidewalls extending linearly from a bottom of the gate structure to a top surface of the source electrode, a second sidewall of the sidewalls extending linearly from the bottom of the gate structure to a top surface of the drain electrode, and a first angle formed by an intersection between the first sidewall and the bottom of the gate structure different from a second angle formed by an intersection between the second sidewall and the bottom of the gate structure.

7. The semiconductor device of claim 6, wherein the source electrode and the drain electrode are laterally adjacent to the dielectric material.

8. The semiconductor device of claim 6, further comprising a gate dielectric material separating the gate structure from the source electrode and from the drain electrode.

9. The semiconductor device of claim 8, wherein the gate dielectric material separates the dielectric material from the source electrode and from the drain electrode.

10. The semiconductor device of claim 6, wherein the first angle comprises the angle formed between the first sidewall and a horizontal line extending from the bottom of the gate structure.

11. The semiconductor device of claim 6, wherein the second angle comprises the angle formed between the second sidewall and a horizontal line extending from the bottom of the gate structure.

12. The semiconductor device of claim 6, wherein an electric field of the gate structure is asymmetric.

13. The semiconductor device of claim 6, wherein the isolation structure is laterally adjacent to the source electrode.

14. The semiconductor device of claim 1, wherein the isolation structure is laterally adjacent to one of the drain electrodes.

15. The semiconductor device of claim 1, wherein the gate stacks comprise a first portion laterally surrounded by a second portion.

16. The semiconductor device of claim 6, wherein the gate structure comprises a dual gate structure.

\* \* \* \* \*

UNITED STATES PATENT AND TRADEMARK OFFICE
CERTIFICATE OF CORRECTION

PATENT NO. : 10,468,416 B2  
APPLICATION NO. : 15/700640  
DATED : November 5, 2019  
INVENTOR(S) : Tieh-Chiang Wu Page 1 of 1

It is certified that error appears in the above-identified patent and that said Letters Patent is hereby corrected as shown below:

On the Title Page  
In ITEM (72) Inventor:  change "Tieh-Chiang Wu, Taoyuan (TW)"  
to --Tieh-Chiang Wu, Taoyuan City (TW)--

In the Specification  
Column 1, Line 9, change "now, U.S. Pat." to --now U.S. Pat.--  
Column 1, Line 10, change "No. 9,768,175 issued" to --No. 9,768,175, issued"--

Signed and Sealed this  
Thirty-first Day of December, 2019

Andrei Iancu  
*Director of the United States Patent and Trademark Office*